United States Patent [19]

Eguchi et al.

[11] Patent Number: 5,714,787
[45] Date of Patent: Feb. 3, 1998

[54] SEMICONDUCTOR DEVICE WITH A REDUCED ELEMENT ISOLATION REGION

[75] Inventors: Kohei Eguchi; Akio Ishikawa, both of Tokyo, Japan

[73] Assignee: Nippon Steel Corporation, Tokyo, Japan

[21] Appl. No.: 567,770

[22] Filed: Dec. 5, 1995

[30]  Foreign Application Priority Data

Dec. 6, 1994  [JP]  Japan  .................................. 6-330158

[51] Int. Cl.⁶ .............................. H01L 29/76; H01L 29/00
[52] U.S. Cl. ........................... 257/394; 257/409; 257/488; 257/508; 257/630
[58] Field of Search ........................... 257/488, 409, 257/503, 508, 630, 394, 372

[56]  References Cited

U.S. PATENT DOCUMENTS 4,825,278   4/1989   Hillenius et al. ..................... 257/488

FOREIGN PATENT DOCUMENTS 6-37106   2/1994   Japan .
7-201967   8/1995   Japan .

OTHER PUBLICATIONS

Wakamiya et al., Fully Planarized 0.5um Technologies For 16M DRAM, IEDM-88, pp.246-249, 1988.

*Primary Examiner*—Minh-Loan Tran
*Attorney, Agent, or Firm*—Pollock, Vande, Sande & Priddy

[57] ABSTRACT

In a semiconductor device and a method for manufacturing the semiconductor device, a width of an element isolation region is reduced by a field-shield. A silicon oxide film of a side wall of a polycrystal silicon film is fabricated by thermally oxidizing a side wall of the polycrystal silicon film, while using a silicon nitride film as an antioxidation film. A width of a field-shield electrode made of the polycrystal silicon film is made smaller than a limit value of the very fine processing.

26 Claims, 9 Drawing Sheets

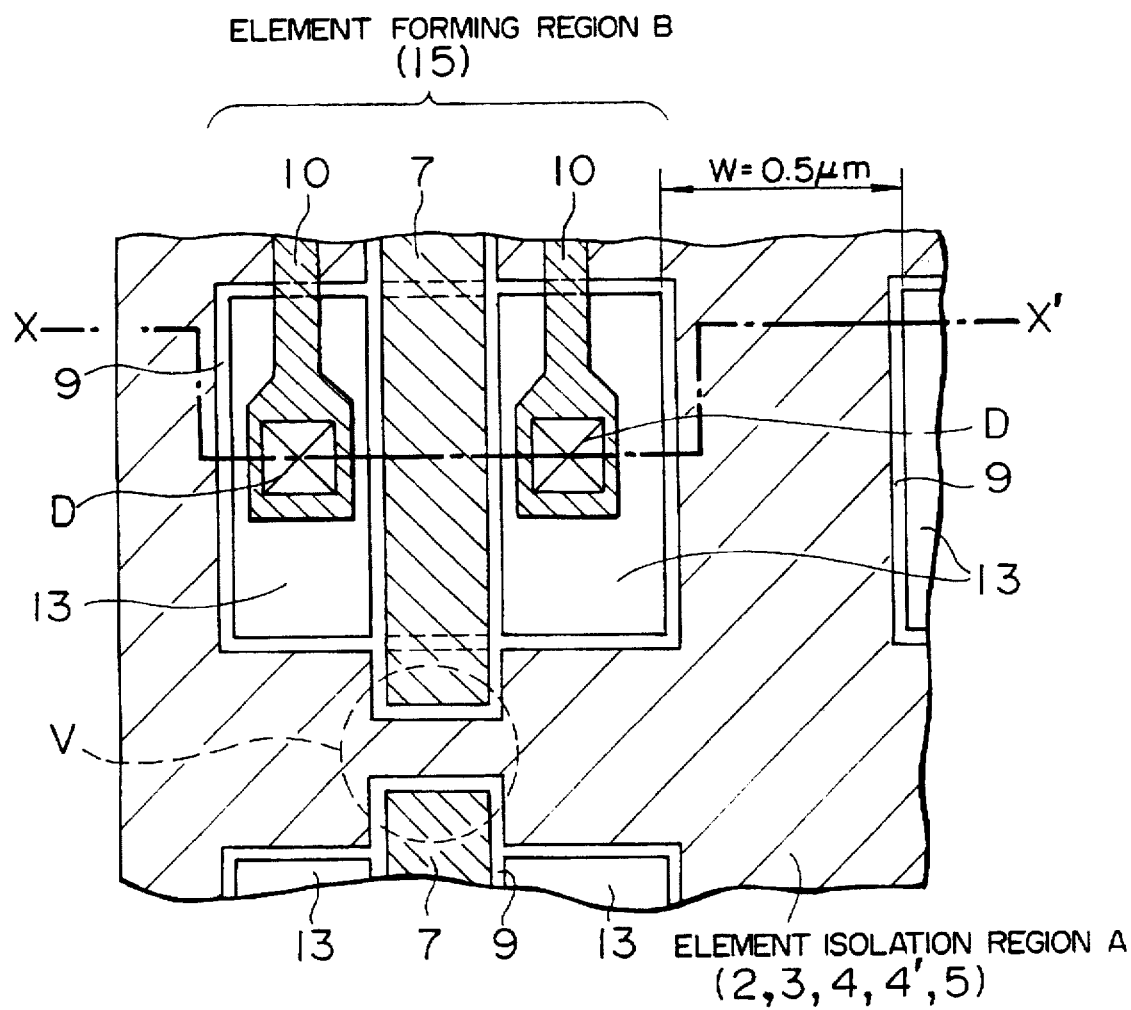

SEMICONDUCTOR DEVICE WITH A REDUCED ELEMENT ISOLATION REGION

BACKGROUND OF THE INVENTION

1. Field of the Invention

The present invention generally relates to a semiconductor device and to a method for manufacturing the semiconductor device, and more specifically, is suitably applied to isolate elements in a semiconductor device.

2. Description of the Related Art

In connection with higher integration of recent semiconductor devices, the conventional element isolating method by the local oxidation of silicon (LOCOS) method owns such difficulties that a "bird's beak" may occur, and an impurity is diffused from an impurity diffusion layer for a channel stop along the lateral direction, resulting in an induction of a narrow channel effect. Accordingly, this conventional element isolating method can hardly be applied to such an element that a design rule is made very fine below a half micron. As a consequence, the field-shield element isolating method is preferred over of the LOCOS method. In this field-shield element isolating method, the potential at the field-shield electrode fabricated via the field-shield insulating film in the element isolation region is fixed to such a fixed potential as the GND (ground) level, so that the propagation of the electric field derived from the wiring layer passing over the field-shield electrode to the under-layer field-shield electrode can be interrupted. It is possible to prevent the parasitic MOS transistor formed in the element isolation region from being conducted.

As a consequence, the field-shield element isolating method may be suitable to achieve very fine processing without any problems of the "bird's beak" as well as the narrow channel effect. As to this field-shield element isolating method, for instance, the publication "Fully Planarized 0.5 μm Technologies For 16M DRAM", IEDM-88, pages 246 to 249 describes that the field-shield element isolating method is applied to the 16M DRAM, thereby achieving a better element isolation characteristic.

FIG. 5 shows an example of the conventional field-shield element isolation structure. In the field-shield element isolation structure, a field-shield electrode 3 is fixed to, for example, the ground potential, and then a surface potential of a silicon substrate 1 in an element isolation region is fixed. As a consequence, the conductivity type of the surface of the silicon substrate 1 in the element isolation region is inverted, so that formations of a parasitic MOS and the like are avoided in this region.

However, in the method for manufacturing the conventional field-shield element isolation structure, as illustrated in FIG. 5, the width "w" of the element isolation region is equal to a value defined by adding twice widths (a+b) of the side wall insulating film 11 and 9 to the width of the field-shield electrode 3.

Accordingly, even if estimating the minimum value, the resultant element isolation region "w" may occupy a region having a length defined by adding twice the widths (a+b) of the side wall insulating films 11 and 9 to the width of the field-shield electrode 3 which is defined by the limit value of the very fine processing. This fact may cause a manufacturing problem when semiconductor devices are more highly integrated. Assuming now that the limit value of the very fine processing is selected to be 0.5 μm under such a condition that the widths (a+b) of the side wall insulating films 11 and 9 require at least 0.1 μm in order to be insulated from the polycrystal silicon film 10 functioning as the electrode drawing portion, the resultant width "w" of the element isolation region becomes 0.7 μm.

Furthermore, in the conventional field-shield element isolating method, the side wall insulating films must be fabricated on the side surfaces of the field-shield electrode in order to electrically insulate the field-shield electrode from other wiring layers. In general, this side wall insulating film is manufactured in such a manner that after the silicon oxide film has been fabricated on the field-shield electrode by the vapor phase epitaxy (VPE) method, the formed silicon oxide film is etched away by way of the anisotropic etching treatment. When the silicon oxide film is etched away, the semiconductor substrate is utilized as the etching stopper. As a result, while the side wall insulating films are manufactured, the semiconductor substrate is damaged by the etching treatment. Thus, another problem is that reliability of the gate insulating film formed in the subsequent manufacturing steps would be lowered.

SUMMARY OF THE INVENTION

Accordingly, an object of the present invention is to provide a semiconductor device and a manufacturing method thereof, capable of reducing damage of a semiconductor substrate, and also of making an element isolation structure very fine by using a simple manufacturing step.

To solve the above-described problems, according to a first aspect of the present invention, in a method for manufacturing a semiconductor device wherein a conductive film is provided directly or, via an insulating film, on an element isolation region of a semiconductor substrate, and a potential at a surface of the semiconductor substrate in the element isolation region is fixed by fixing a potential at the conductive film, the manufacturing method comprises the steps of:

sequentially forming both a polycrystal or amorphous silicon film and a silicon nitride film directly or via said insulating film on the semiconductor substrate;

removing both a polycrystal or amorphous silicon film and a silicon nitride film located in the substrate region other than the element isolation region; and, thereafter, thermally oxidizing a side surface of the polycrystal, or amorphous silicon film, while using the nitride film as a mask.

As previously explained, according to the first aspect of the present invention, the side surface of either the polycrystal film or the amorphous silicon film, which will constitute the field-shield electrode, is thermally oxidized to thereby form a side wall for an insulation purpose. As a result, the dimension of the field-shield electrode can be made smaller than the limit value of the very fine processing. Thus, the overall width of the element isolation region can also be made narrow.

According to a second aspect of the present invention, a method for manufacturing a semiconductor device comprises the steps of:

forming a first insulating film on a semiconductor substrate;

forming a conductive film on the first insulating film;

forming a second insulating film on the conductive film;

selectively removing both of the second insulating film and the conductive film by etching; and oxidizing a side surface of the conductive film.

According to the second aspect of the present invention, since an oxide film is formed on the side surface of the conductive film by oxidizing the side surface of the conductive film fabricated via the first insulating film on the semiconductor substrate, such an element isolation structure is capable of insulating the field-shield electrode from other wiring layers and reducing the dimension converting difference. Thus, a very fine element isolation structure can be fabricated by simple manufacturing steps. Also, since the insulating film can be formed on the side surface without etching process, it is possible to form an element isolation structure capable of reducing the damage to the semiconductor substrate caused by the etching process.

BRIEF DESCRIPTION OF THE DRAWINGS

FIG. 2 is a plan view illustrating the semiconductor device according to the first embodiment of the present invention;

DESCRIPTION OF THE PREFERRED EMBODIMENTS

Figure 1A:
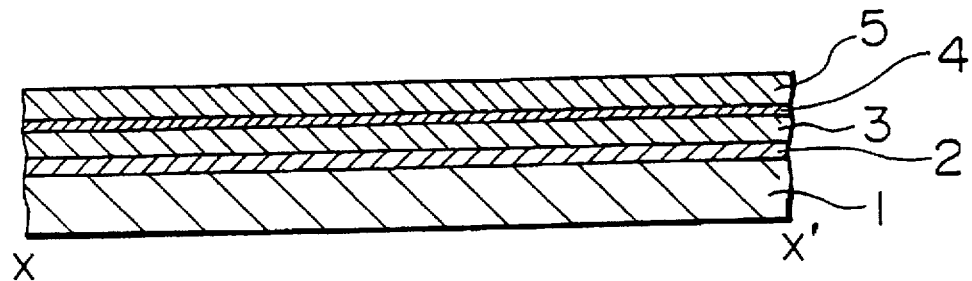
FIGS. 1A to 1H are sectional views schematically showing the steps of manufacturing a semiconductor device having a field-shield element isolation structure according to a first embodiment of the present invention.
Figure 1B:
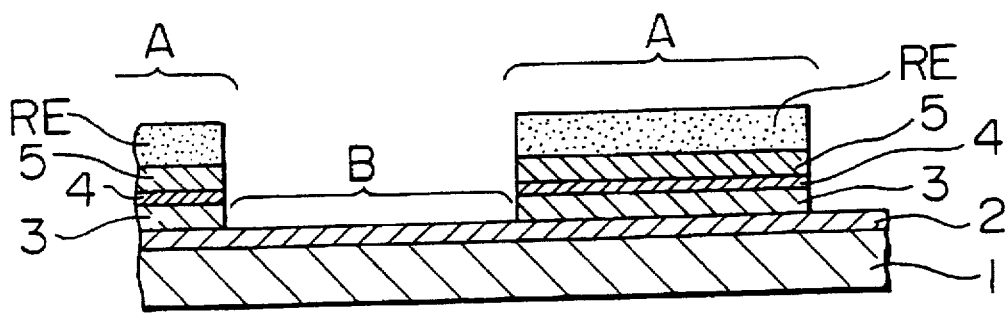
Figure 1C:
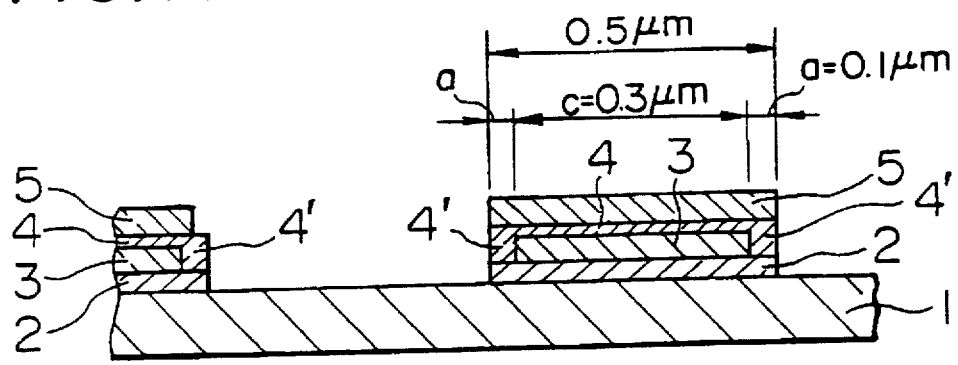
Figure 1D:
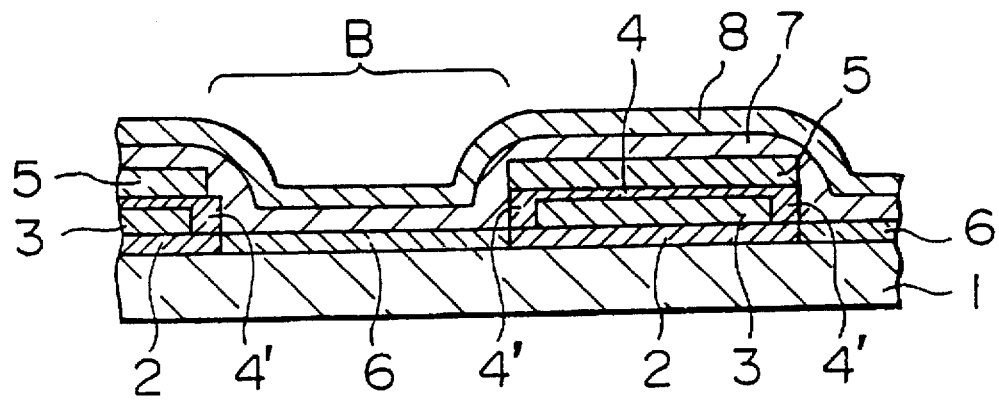
Figure 1E:
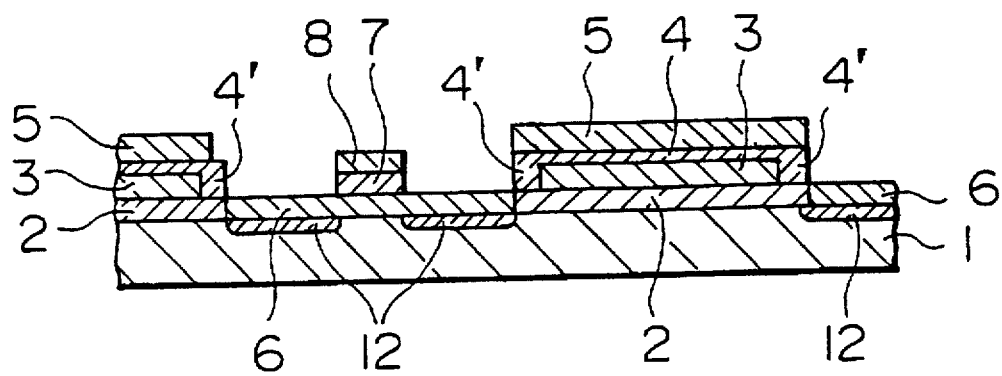
Figure 1F:
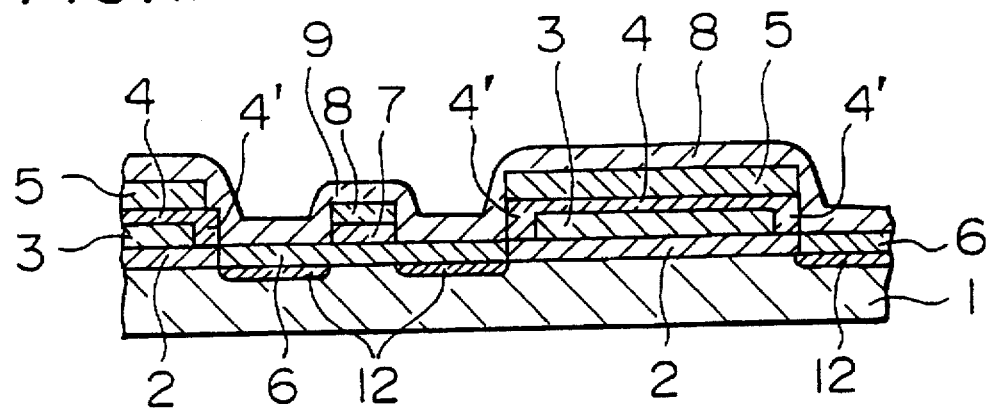
Figure 1G:
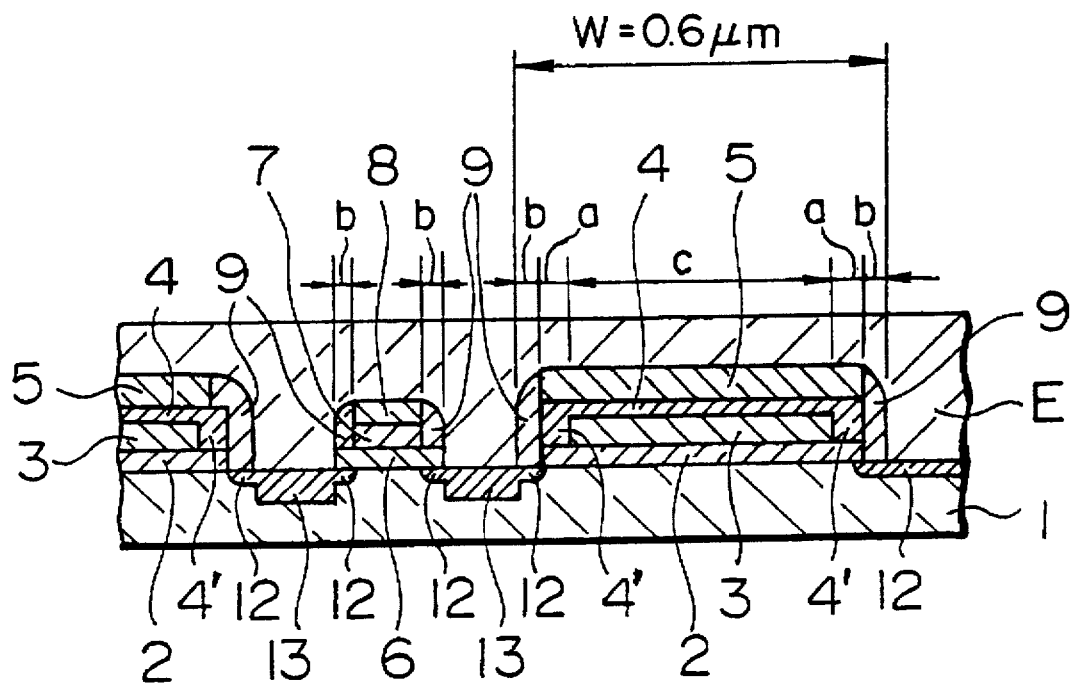
Figure 1H:
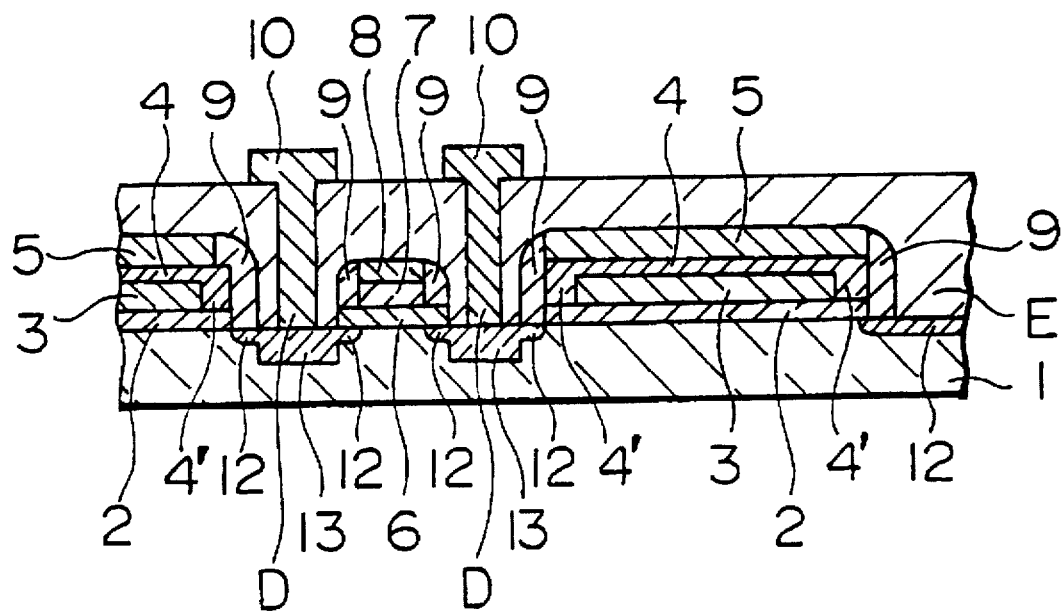

Referring now to FIGS. 1A to 1H and FIG. 2, a semiconductor device according to a first embodiment of the present invention will be described. A manufacturing step diagram of the semiconductor device according to the first embodiment shown in FIG. 1H is a cross-sectional view illustrating the semiconductor, taken along a line X-X' of a plan view shown in FIG. 2.

First, as shown in FIG. 1A, after a silicon oxide film 2 having a thickness of 30 nm has been formed on the entire surface of a silicon substrate 1 by the thermal oxidation method, a polycrystal silicon film 3 having a thickness of 200 nm and containing an impurity is fabricated on the entire surface of the resultant silicon substrate 1 by the CVD (chemical vapor deposition) method. Furthermore, after a silicon oxide film 4 having a thickness of 10 nm has been formed on the entire surface of the polycrystal silicon film 3 by the thermal oxidation method, a silicon nitride film 5 having a thickness of 300 nm is formed on the entire surface of the resultant silicon oxide film 4 by the CVD method.

Next, as indicated in FIG. 1B, a portion which will constitute an element isolation region "A" is covered with a resist "RE" by using lithographic technology, and thereafter, the silicon nitride film 5, the silicon oxide film 4, and the polycrystal silicon film 3 of a region on which the resist RE is not formed (namely, element forming region "B") are selectively etched away by using a method such as RIE (reactive ion etching). The silicon nitride film 5, the silicon oxide film 4, and the polycrystal silicon film 3 of the element forming region B on which no resist RE is fabricated are then removed, whereas the silicon nitride film 5, the silicon oxide film 4, and the polycrystal silicon film 3 of the element isolation region A are left. At this time, the width of the etched polycrystal silicon film 3 can be made narrow to a width limit of the very fine processing technique. The width of this polycrystal silicon film 3 is made to be 0.5 μm.

Thereafter, as illustrated in FIG. 1C, after the etching process of FIG. 1B is completed, the resist RE is removed.

Subsequently, while the silicon nitride film 5 is used as an anti-oxidation film, the silicon substrate 1 is treated by thermal oxidation so that a silicon oxide films 4', each having a thickness "a" of about 0.2 μm, are fabricated on side walls of the polycrystal silicon film 3. At this time, since each width of approximately 0.1 μm of the polycrystal silicon film 3 within the entire width of 0.5 μm thereof is used in order to form the silicon oxide film 4' having a thickness of about 0.2 μm, the width "c" of the polycrystal silicon film 3 is reduced to 0.3 μm, and a width "c" of a field-shield electrode 3 made of this polycrystal silicon film can be made narrower than the limiting value of the very fine processing. At this time, the combined width (c+2a) of the field-shield electrode 3 and the silicon oxide films 4' located on both sides of the field-shield electrode 3 becomes approximately 0.7 μm.

In the thermal oxidation phase at this time, the temperature is set to 900° C. and the time is set to 90 minutes, and the pyrogenic oxidation whose flow rate is selected to be $O_2$:$H_2$=2:1 is carried out. Although not shown in the drawings, when the side walls of the polycrystal silicon film 3 are thermally oxided, the silicon oxide film having a thickness of about 100 nm even grows on the silicon substrate 1.

Next, after the etching process is carried out by utilizing the RIE or the like in order that the film thickness of the silicon oxide film 2 (not shown) on the element forming region becomes 50 nm, the silicon oxide films 4' on the side walls of the polycrystal silicon film 3 are etched away by wet etching using a hydrogen fluoride solution, so that the thickness of approximately 0.1 μm of each silicon oxide film 4' is removed. At the same time, the silicon oxide film 2 on the element forming region is substantially completely removed. FIG. 1C represents the condition at this time. At this time, since the thickness "a" of each silicon oxide film 4' becomes approximately 0.1 μm, a total width (c+2a) of the field-shield electrode 3 and the silicon oxide films 4' located on both sides thereof reaches about 0.5 μm.

After the wet etching, as apparent from FIG. 1C, at least a portion of each silicon oxide film 4' is formed toward the inner side of the polycrystal silicon film 3 from a vertical plane including a vertical edge position of either the silicon oxide film 2 or the silicon nitride film 5, and then is in contact with the polycrystal silicon film 3 at this inner side.

It should be noted that the silicon nitride film 5 may be removed.

Next, as shown in FIG. 1D, a silicon oxide film 6 having a thickness of 10 nm is formed as a gate oxide film on the silicon substrate 1 of the element forming region B by the thermal oxidation method.

Then, a polycrystal silicon film 7 having a thickness of 200 nm and a silicon oxide film 8 having a thickness of 200 nm are formed on the entire surface of the resultant semiconductor device by the CVD method or the like.

Next, as illustrated in FIG. 1E, after the portion which will constitute the gate electrode is covered with the resist by lithography technique, both the silicon oxide film 8 and the polycrystal silicon film 7 containing the impurity are etched, by way of the RIE method or the like, so that a gate electrode 7 is fabricated. A cap oxide film 8 made of the silicon oxide film 8 is present on this gate electrode 7.

Next, while the gate electrode 7 and the field-shield electrode 3 and the oxide or nitride film thereon are used as a mask, the ion is injected to form an impurity diffusion layer 12 of low concentration within the silicon substrate 1.

Then, as shown in FIG. 1F, a silicon oxide film 9 having a thickness of 50 nm is formed on the entire surface of the resultant semiconductor device by the CVD method and the like.

Subsequently, as illustrated in FIG. 1G, an anisotropic etching is carried out by the RIE method so that silicon oxide films 9, each having a thickness of 0.05 μm, are left only on the side wall portions of the gate electrode 7 and the field-shield electrode 3 to thereby form side wall insulating films 9 on the side wall portions of the gate electrode 7 and the field-shield electrode 8. At this time, the width "w" of the element isolation region becomes w=c+2a+2b, namely about 0.6 μm.

Next, while the gate electrode 7 and the field-shield electrode 3 and their side wall insulating films 9, etc. are used as a mask, the ion is injected to form an impurity diffusion layer 12 of high concentration within the silicon substrate 1.

Next, after an interlayer insulating film E has been formed on the entire surface of the silicon substrate 1, as represented in FIG. 1H and FIG. 2, a contact hole D reaching the impurity diffusion layer 13 is fabricated. Then, a polycrystal silicon film 10 having a thickness of about 200 nm and containing an impurity, has been fabricated on the entire surface of the silicon substrate 1, and thereafter is patterned to thereby form a drawing wire 10 for source/drain electrodes.

With the above-described manufacturing steps, a field-shield element isolation structure can be fabricated in which the width of the field-shield electrode 3 can be made lower than the limiting value of the very fine processing. In a manufacturing step, after the manufacturing step of FIG. 1H, the potential at the field-shield electrode 2 is controlled to become a fixed potential, for instance, GND (ground) potential.

Although only one element forming region B (including the gate electrode 7, the gate insulating film 6 and the impurity diffusion layers 12 and 13) is shown in FIG. 1A 1H and FIG. 2, a plurality of element forming regions B are fabricated in a matrix form in an actual semiconductor chip, and each of these element forming regions B is surrounded by the element isolation region A (including the field-shield insulating film 2 and the field-shield electrode 3). In each selected region of the plural element forming regions B, an active MIS (metal insulator semiconductor) type transistor 15 is formed, whereas a field-shield electrode structure of the MIS type is fabricated in the element isolation region A.

Source/drain regions (each including the low-concentration impurity diffusion layer 12 and the high-concentration impurity diffusion layer 13) of the element forming region B are connected via the contact holes D to the wiring layer 10. As illustrated by the symbol V of FIG. 2, a portion of the gate electrode 7 of the element forming region B may be formed in such a manner that this portion bridges over the field-shield electrode 3.

While the semiconductor device according to the first embodiment of the present invention has been described, the present invention is not limited to the above-explained embodiment, but may be modified and changed without departing from the technical scope and spirit of the present invention. For example, an amorphous film may be employed instead of the polycrystal silicon film 3. Also, the silicon oxide film 2 may be substituted by an ONO film (namely, three-layer film constructed of a silicon oxide film/a silicon nitride film/a silicon oxide film).

Although thermal oxidation has been carried out in such a manner that the thickness "a" of the silicon oxide film 4' formed on the side wall of the field-shield electrode 3 becomes 0.2 μm in the above-described embodiment, this thickness "a" may be selected to be larger than 0.2 μm. Accordingly, this may make the width "w" of the element isolation region thinner. That is, after the silicon oxide films 4' have been fabricated on the side walls of the field-shield electrode 3, the film thickness of each silicon oxide film 4' is made thinner by wet etching using a hydrogen fluoride solution so that the width "w" of the element isolation region may be made thinner. At this time, since the silicon nitride film 5 cannot be dissolved with respect to the hydrogen fluoride solution, the thickness of the silicon oxide film 4 formed on the field-shield electrode 3 is not reduced. As a consequence, if the width of the field-shield electrode 3 is within an effective range, then the width "w" of the element isolation region can be made thin irrespective of the limiting value of the very fine processing.

In the first embodiment, the step of forming the silicon oxide film 2 may be omitted in order to form the polycrystal silicon film 3 directly on the silicon substrate 1.

Also, in the first embodiment, the silicon oxide film 4 is fabricated as the cap insulating film of the polycrystal silicon film 3, and furthermore the silicon nitride film 5 is formed on this silicon oxide film 4. Alternatively, the silicon nitride film 5 may be directly formed on the polycrystal silicon film 3, and the silicon nitride film 5 may be utilized as the cap insulating film of the polycrystal silicon film 3. As a consequence, the silicon oxide film 4 on the polycrystal silicon film 3 may be omitted.

In accordance with the first embodiment, the width of the element isolation region with the field-shield element isolation structure can be made thinner than that of the conventional element isolation region, so that the semiconductor device can be made in higher integration.

Figure 3A:
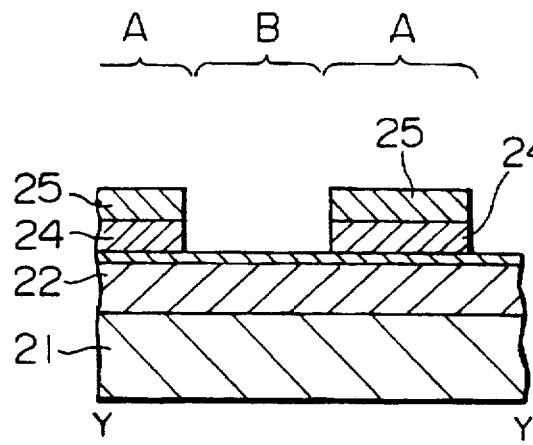
FIGS. 3A to 3N are sectional views representing a manufacturing method of a semiconductor device according to a second embodiment of the present invention, in a manufacturing stage sequence.

Referring now to the drawings, a description will be provided of a method for manufacturing a semiconductor device according to a second embodiment of the present invention. FIG. 3A to FIG. 3N are sectional views representing the method of manufacturing the semiconductor device according to the second embodiment in the manufacturing step sequence. FIG. 4 is a plan view illustrating the semiconductor device according to the second embodiment of the present invention. The drawings at the left side of FIG. 3A 3N show cross-sectional views of the semiconductor device, taken along a line Y-Y' of FIG. 4. The drawings at the right side of FIG. 3A–3N indicate cross-sectional views of the semiconductor device, taken along a line Z-Z'.

Figure 3B:
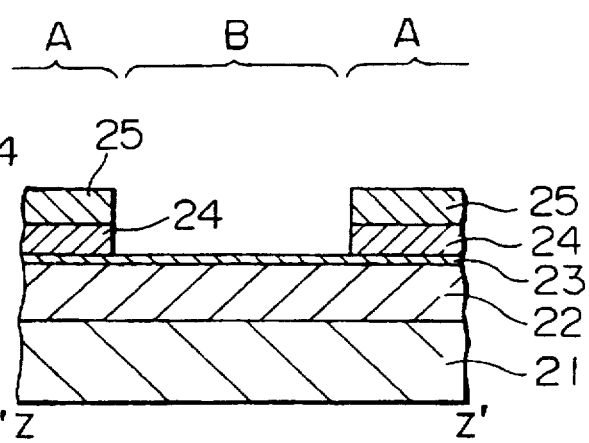

As indicated in FIG. 3A and FIG. 3B, an ion is injected into a P type semiconductor substrate 21 under such a condition that for example, boron is injected as a P type impurity, the injection energy of which is 60 KeV, and the dose amount of which is $1\times10^{13} cm^{-2}$. The ion-injected P type semiconductor substrate 21 is thermally treated at a temperature of 1100° C. for about so as 6 hours so as to diffuse and activate the above-explained P type impurity so as to form a P well diffusion layer 22. Next, the surface of this P type semiconductor substrate 21 is thermally oxided to fabricate a field-shield oxide film 23 having a thickness in the order of 50 nm, and a polycrystal silicon film 24 with a thickness in the order of 200 nm is formed on the field-shield oxide film 23 by the CVD method. Thereafter, an impurity such as phosphorus is thermally diffused into the above-described polycrystal silicon film 24 to increase conductivity, and then a silicon nitride film 25 having a thickness of about 250 nm is fabricated on the polycrystal silicon film 24 by using the CVD method. Then, while the photoresist pattern formed on the silicon nitride film 25 on the element isolation region A is used as a mask, both the silicon nitride film 25 and the polycrystal silicon film 24 formed on the element forming region B are etched so as to be removed. As a result, a field-shield electrode 24 made of the polycrystal silicon film on which a cap insulating film 25 made of the silicon nitride film 25 has been stacked is fabricated in the element isolation region A.

Figure 3C:
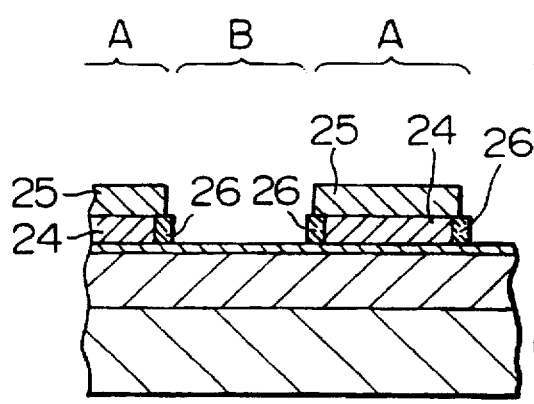
Figure 3D:
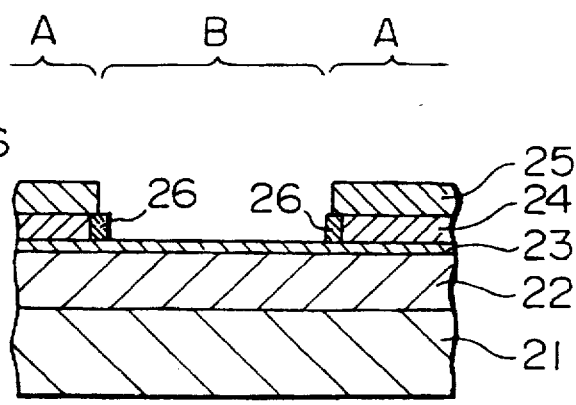

Next, as indicated in FIG. 3C and FIG. 3D, the thermal oxidation is carried out within the oxygen atmosphere at a temperature of about 850° C. for approximately 30 minutes to oxidize the side surfaces of the field-shield electrode 24, so that a side wall oxide films 26, each having a thickness of about 50 to 200 nm is formed on the side surfaces of the field-shield electrode 24. At this time, since the cap insulating film 25 made of the silicon nitride film has been fabricated on the upper surface of the field-shield electrode 24, the oxidization of the field-shield electrode 24 progresses from the side surface direction. In case that a monocrystal silicon substrate is used as the P-type semiconductor substrate 21, although the surface of this P-type semiconductor substrate 21 is also oxidized, the oxidation speed of the polycrystal silicon is normally faster than the oxidation speed of the monocrystal silicon, and therefore the surface oxidation of the P-type semiconductor substrate 21 can be suppressed by controlling the temperatures and times when the thermal oxidation is performed. Furthermore, an impurity such as phosphorus is doped into the polycrystal silicon film 24 in high concentration more than $10^{20}$ cm$^{-3}$, so that the oxidation speed of the polycrystal silicon film 24 can be increased, and thus, the surface oxidation of the P type semiconductor substrate 21 can be suppressed.

Figure 3E:
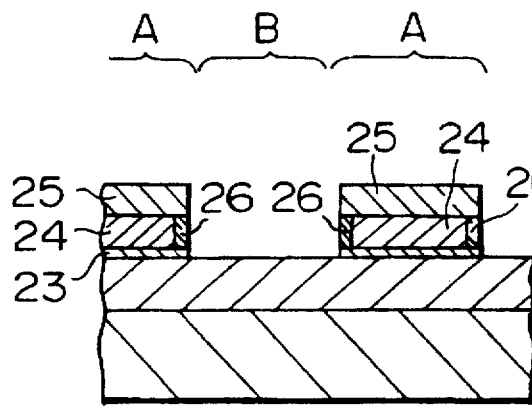
Figure 3F:
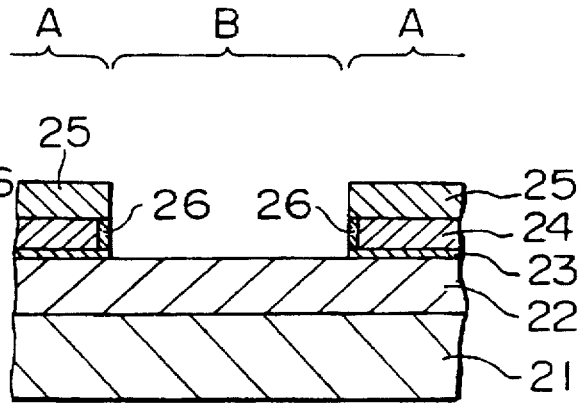

Next, as illustrated in FIG. 3E and FIG. 3F, wet etching is performed using a hydrogen fluoride solution whose concentration is selected to be, for instance, 0.5% for 20 minutes, so that the field-shield oxide film 23 of the element forming region B is removed. At this time, since the side wall oxide films 26 are also etched, the thickness of each side wall oxide film 26 is made slightly thin.

After this wet etching treatment, at least one portion of each side wall oxide film 26 is fabricated toward the inner side of the polycrystal silicon film 24 from the edge position of either the silicon oxide film 23 or the silicon nitride film 25, and is in contact with the polycrystal silicon film 24 at this inner side.

Figure 3G:
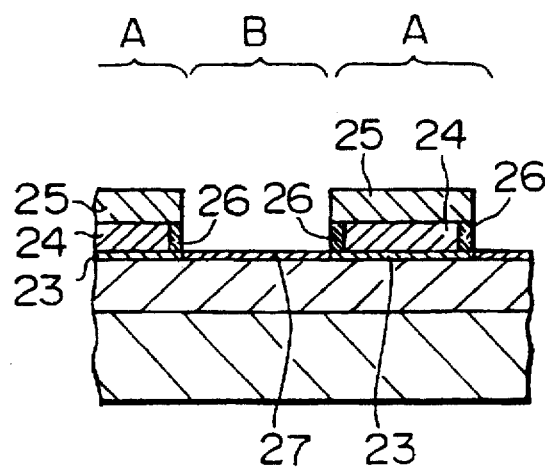
Figure 3H:
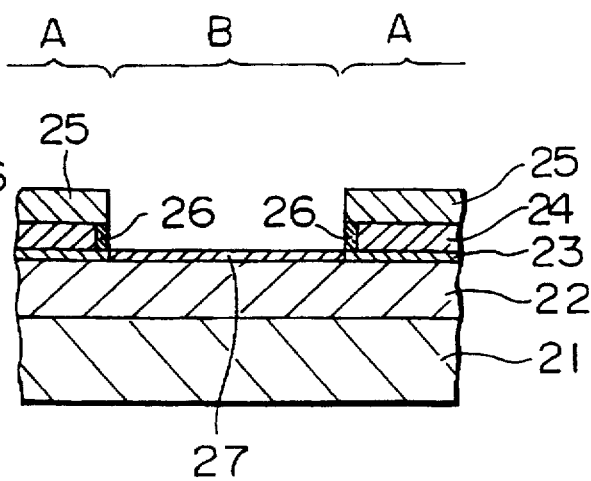

Next, as shown in FIG. 3G and FIG. 3H, the P type semiconductor substrate 21 is thermally oxidized, so that a gate oxide film 27 having a thickness of about 15 nm is fabricated in the element forming region B on the P type semiconductor substrate 21.

Figure 3I:
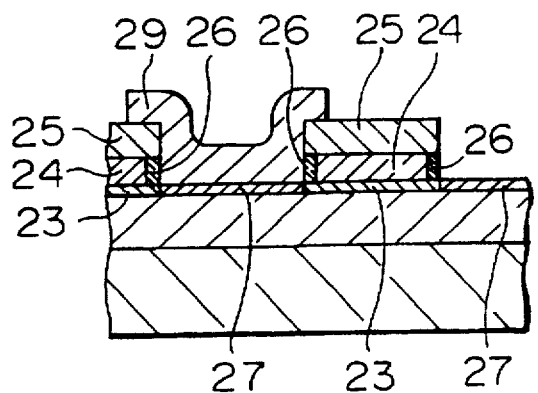
Figure 3J:
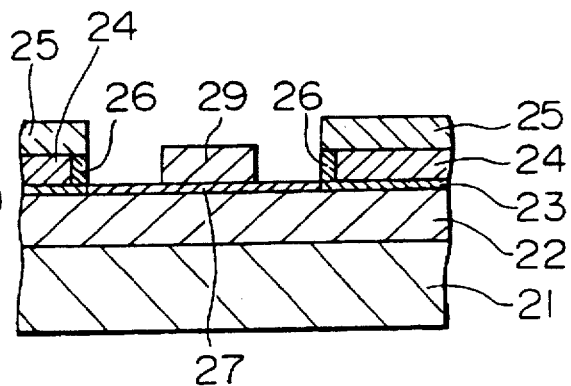

Subsequently, as shown in FIG. 3I and FIG. 3J, a polycrystal silicon film 29 is formed on the gate oxide film 27 by way of the CVD method, and an impurity such as phosphorus is thermally diffused to increase conductivity. Then, while the photoresist formed in a pattern of the gate electrode is used as a mask, the above-explained polycrystal silicon film 29 is selectively removed by the etching process, so that a polycrystal silicon gate 29 is fabricated.

Figure 3K:
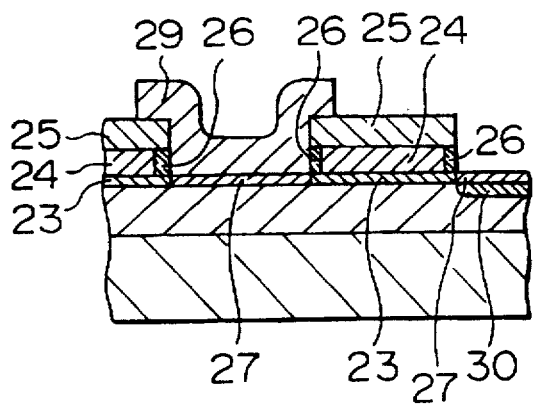
Figure 3L:
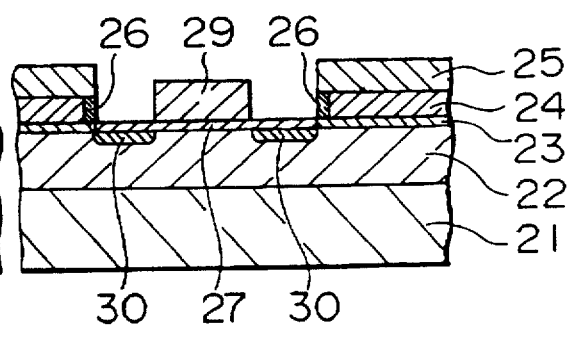

Next, as indicated in FIG. 3K and FIG. 3L, while using both the field-shield electrode 24 and the polycrystal silicon gate 29 as a mask, for instance, arsenic is ion-injected as an N type impurity into the P type semiconductor substrate 21 under such a condition that ion injection energy is 60 KeV and a dose amount is $5 \times 10^{15}$ cm$^{-3}$, so that a source/drain diffusion layer 30 is formed.

Figure 3M:
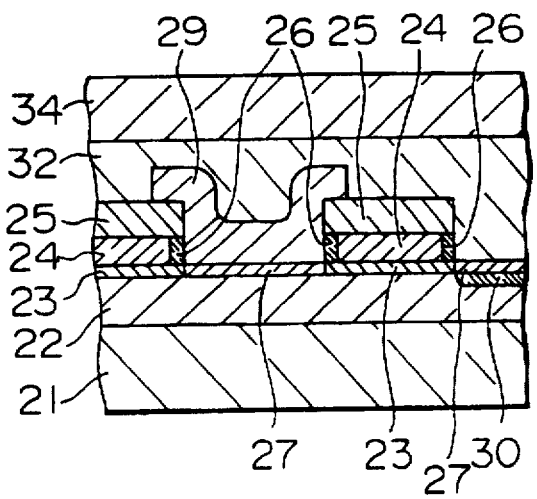
Figure 3N:
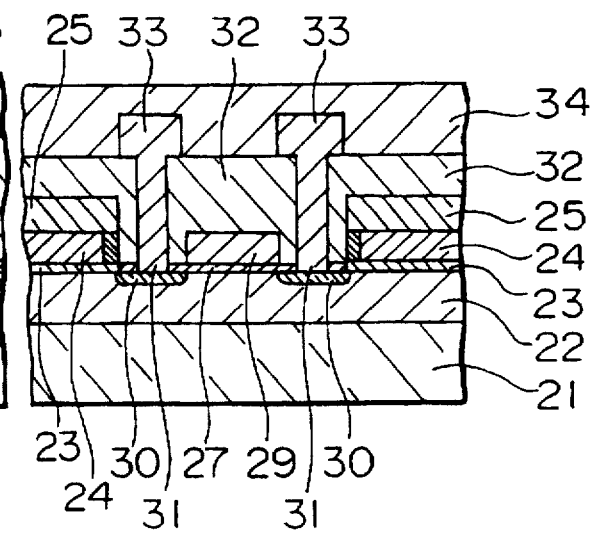
Figure 4:
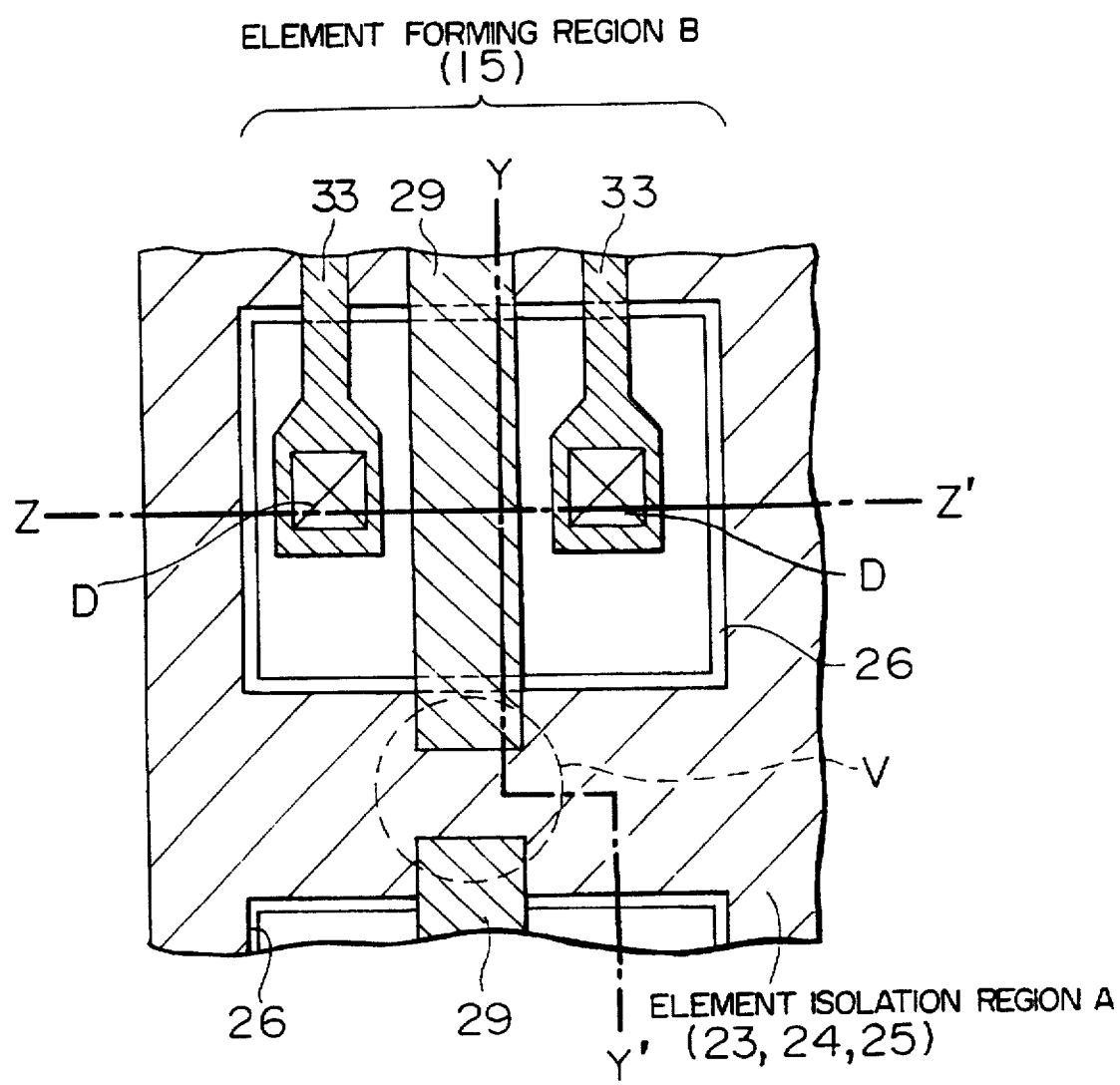
FIG. 4 is a plan view illustrating the semiconductor device according to the second embodiment of the present invention.
Figure 5:
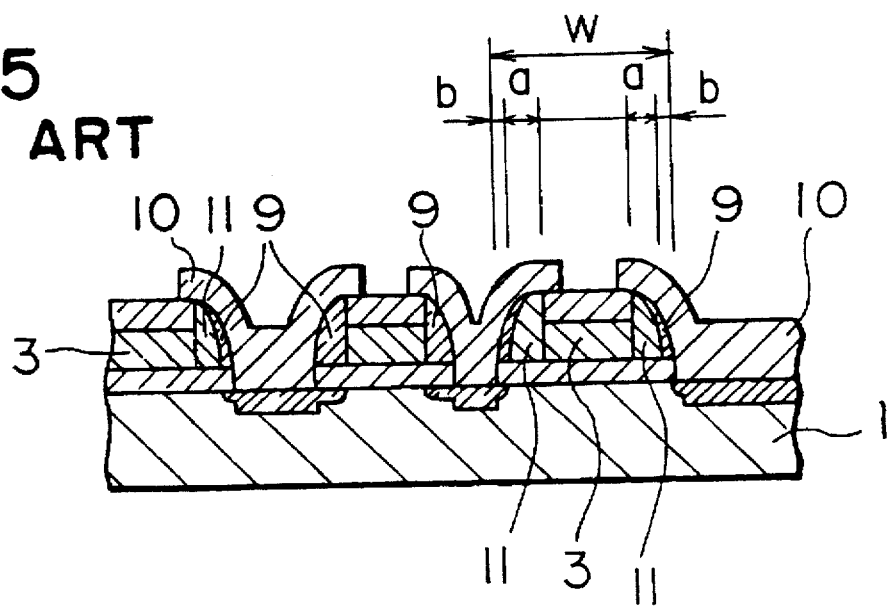
FIG. 5 is a sectional view schematically showing the conventional semiconductor device having the field-shield isolation structure.

Next, as shown in FIG. 3M and FIG. 3N, after an interlayer insulating film 32 has been fabricated by way of the CVD method, while the photoresist pattern formed on the interlayer insulating film 32 is used as a mask, both the interlayer insulating film 32 and the gate oxide film 27 are etched away to thereby fabricate contact holes 31 in preselected regions on the source/drain diffusion layer 30. Thereafter, aluminum containing silicon and copper is deposited on the interlayer insulating film 32 using either the sputtering method, or the vapor deposition method, so that the patterning is carried out to form an aluminum wiring pattern 33. Then, a passivation film 34 is formed on the aluminum wiring pattern 33.

Although only one element forming region B (including gate electrode 29, gate insulating film 27, and impurity diffusion layer 30) is shown in FIG. 3A to FIG. 3N and FIG. 4, a plurality of element-forming regions B are fabricated in a matrix form in an actual semiconductor chip, and each of these element-forming regions B is surrounded by the element isolation region A (including the field-shield insulating film 23, and the field-shield electrode 24). In each selected region of the plural element forming regions B, an active MIS (metal insulator semiconductor) type transistor 15 is formed, whereas a field-shield electrode structure of the MIS type is fabricated in the element isolation region A.

Source/drain regions (impurity diffusion layer 30 of the element forming region B) are connected via the contact holes D to the wiring layer 33. As illustrated by a line Y-Y' of FIG. 4, a portion of the gate electrode 29 of the element forming region B may be formed in such a manner that this portion bridges over the field-shield electrode 24, (see symbol V of FIG. 4).

It should be noted that the potential at the field-shield electrode 24 is so controlled as to become a fixed potential, for instance, GND (ground) potential.

In the second embodiment, the step of forming the field-shield oxide film 23 also may be omitted in order to form the polycrystal silicon film 24 directly on the P well diffusion layer 22.

While the semiconductor device according to the first and second embodiments of the present invention have been described, the present invention is not limited to the above-explained embodiment, but may be modified and changed without departing from the technical scope and spirit of the present invention. For example, in the first and second embodiments, polycrystal silicon has been employed as the field-shield electrode 3 or 24. Alternatively, other materials such as amorphous silicon, silicide, and polycide may be properly employed. Also, the silicon nitride film has been employed as the material of the cap insulating film 25. As this cap insulating film 25, other anti-oxidation films than the silicon nitride film may be utilized, and either a two-layer structure constructed of a silicon oxide film and a silicon nitride film, or a stacked layer structure such as an ONO film may be utilized. Although the silicon oxide film has been employed as the field-shield insulating film 12 or 23 in the first and second embodiments, either a two-layer structure constructed of a silicon oxide film and a silicon nitride film, or a stacked layer structure such as an ONO film may be employed.

It should be noted that although the present invention has been applied to manufacture the transistors, the present invention may be similarly applied to manufacture a semiconductor memory device such as a DRAM or an EEPROM, and other semiconductor devices such as a gate array.

Furthermore, by performing the manufacturing step shown in FIG. 3E and FIG. 3F where the field-shield oxide film 23 of the element forming region is removed after the field-shield electrode 24 indicated in FIG. 3A and FIG. 3B has been formed, the side surfaces of the field-shield electrode 24 may be oxidized at the same time by the thermal oxidation to fabricate the gate oxide film 27 shown in FIG. 3G and FIG. H, so that the side wall oxide films 26 are formed. As a consequence, the thermal oxidizing steps as represented in FIG. 3C and FIG. 3D may be omitted.

As previously described in detail, according to the present invention, since the oxide films are formed on the side surfaces of the conductive film by oxidizing the side surfaces of the conductive film fabricated via the first insulating film on the semiconductor substrate, such an element isolation structure capable of reducing the dimension converting difference can be fabricated by the simple manufacturing stages. Therefore, integration of the semiconductor device can be improved. Also, an element isolation structure capable of reducing damage to the semiconductor substrate can be fabricated so that since reliability of the gate insulating film formed in the subsequent manufacturing step is improved, higher reliability of the semiconductor device can be achieved.

I claim:

1. A semiconductor device comprising:
    a semiconductor substrate;
    a first insulating film formed on an element isolation region of said semiconductor substrate;
    a conductive film, formed on said first insulating film, for setting a potential at a surface of said semiconductor substrate in said element isolation region by setting a potential at said conductive film;
    a second insulating film formed on said conductive film and including a nitride film;
    an oxide film formed on a side surface of said conductive film by oxidizing said conductive film so that said oxide film is formed between said first and second insulating films;
    a gate insulating film and a gate electrode formed on said semiconductor substrate other than said element isolation region; and
    a source/drain region formed in said semiconductor substrate other than said element isolation region.

2. A semiconductor device as claimed in claim 1 wherein:
    said element isolation region is fabricated so as to surround said source/chain region.

3. A semiconductor device as claimed in claim 1 wherein:
    said conductive film contains a material selected from polycrystal silicon, amorphous silicon, silicide, and polycide.

4. A semiconductor device as claimed in claim 1 wherein:
    said first insulating film contains an oxide film.

5. A semiconductor device as claimed in claim 1 wherein:
    said first insulating film contains a nitride film.

6. A semiconductor device according to claim 1, wherein:
    said second insulating film has a two-layer structure including a nitride film and an oxide film.

7. A semiconductor device comprising:
    a semiconductor substrate;
    a first insulating film formed on an element isolation region of said semiconductor substrate;
    a conductive film, formed on said first insulating film, for setting a potential at a surface of said semiconductor substrate in said element isolation region by setting a potential at said conductive film;
    a second insulating film formed on said conductive film and including a nitride film; and an oxide film formed on a side surface of said conductive film by oxidizing said conductive film.

8. A semiconductor device as claimed in claim 7, further comprising:
    a transistor formed in said semiconductor substrate other than said element isolation region.

9. A semiconductor device as claimed in claim 8 wherein:
    said element isolation region surrounds at least a region where said transistor is formed.

10. A semiconductor device as claimed in claim 7 wherein:
    said conductive film contains a material selected from polycrystal silicon, amorphous silicon, silicide, and polycide.

11. A semiconductor device as claimed in claim 7 wherein:
    said first insulating film contains an oxide film.

12. A semiconductor device as claimed in claim 7 wherein:
    said first insulating film contains a nitride film.

13. A semiconductor device as claimed in claim 7 wherein:
    said second insulating film contains at least a silicon nitride film.

14. A semiconductor device as claimed in claim 7 wherein:
    said second insulating film contains a stacked layer thin film including at least an oxide film and a nitride film.

15. A semiconductor device comprising:
    a semiconductor substrate;
    a first insulating film formed on an element isolation region of said semiconductor substrate;
    a conductive film formed on said first insulating film;
    a second insulating film formed on said conductive film and including a nitride film; and
    a third insulating film formed on a side wall of said conductive film;
    wherein at least one portion of said third insulating film is formed between an edge of said conductive film and a vertical edge plane of said second insulating film.

16. A semiconductor device as claimed in claim 15 wherein:
    at least one portion of said third insulating film is formed between an edge of said conductive film and a vertical edge plane of said first insulating film.

17. A semiconductor device as claimed in claim 15 wherein:
    at least said third insulating film is in contact with said conductive film at an inner side than a vertical edge position of said first insulating film.

18. A semiconductor device as claimed in claim 15 wherein:
    said second insulating film contains at least a silicon nitride film.

19. A semiconductor device as claimed in claim 15 wherein:
    said second insulating film contains a stacked layer thin film including at least an oxide film and a nitride film.

20. A semiconductor device as claimed in claim 15, further comprising:
    a transistor formed in said semiconductor substrate other than said element isolation region.

21. A semiconductor device as claimed in claim 20 wherein:

said element isolation region surrounds at least a region where said transistor is formed.

22. A semiconductor device as claimed in claim 15 wherein:

said conductive film contains a material selected from polycrystal silicon, amorphous silicon, silicide, and polycide.

23. A semiconductor device as claimed in claim 15 wherein:

said first insulating film contains an oxide film.

24. A semiconductor device as claimed in claim 15 wherein:

said first insulating film contains a nitride film.

25. A semiconductor device wherein a conductive film is provided over a semiconductor substrate and adjacent active regions at a surface of said semiconductor substrate, which are divided by said conductive film, are electrically separated by setting a voltage of said conductive film to a predetermined value, said semiconductor device comprising:

said conductive film formed over said semiconductor substrate;

an anti-oxidation film formed on said conductive film; and a side wall oxide film formed on a side wall of said conductive film;

wherein at least one portion of said side wall oxide film is formed between an edge of said conductive film and a vertical edge plane of said anti-oxidation film.

26. A semiconductor device according to claim 25, further comprising an insulating film formed between said semiconductor substrate and said conductive film.

* * * * *